(12) United States Patent
Gong et al.

(10) Patent No.: US 8,102,015 B2
(45) Date of Patent: Jan. 24, 2012

(54) MICROPHONE PACKAGE WITH MINIMUM FOOTPRINT SIZE AND THICKNESS

(75) Inventors: Shih-Chin Gong, Taipei (TW); Wei-Chan Hsu, Cupertino, CA (US)

(73) Assignee: Fortemedia, Inc., Sunnyvale, CA (US)

( * ) Notice: Subject to any disclaimer, the term of this patent is extended or adjusted under 35 U.S.C. 154(b) by 703 days.

(21) Appl. No.: 12/244,168

(22) Filed: Oct. 2, 2008

(65) Prior Publication Data
US 2010/0086164 A1    Apr. 8, 2010

(51) Int. Cl.
*H01L 29/84*    (2006.01)
*H04R 9/08*    (2006.01)
(52) U.S. Cl. ............ 257/416; 257/704; 257/E23.193; 381/355; 381/361
(58) Field of Classification Search .......... None
See application file for complete search history.

(56) References Cited

U.S. PATENT DOCUMENTS

| | | | |
|---|---|---|---|
| 6,178,249 B1 * | 1/2001 | Hietanen et al. | 381/174 |
| 6,522,762 B1 | 2/2003 | Mullenborn et al. | |
| 6,781,231 B2 | 8/2004 | Minervini | |
| 7,202,552 B2 * | 4/2007 | Zhe et al. | 257/659 |
| 7,224,812 B2 * | 5/2007 | Chang | 381/174 |
| 2007/0278601 A1 | 12/2007 | Goodelle et al. | |
| 2008/0164545 A1 * | 7/2008 | Hsiao | 257/416 |
| 2009/0101998 A1 * | 4/2009 | Yen et al. | 257/416 |
| 2009/0175477 A1 * | 7/2009 | Suzuki et al. | 381/355 |

* cited by examiner

*Primary Examiner* — Alonzo Chambliss
(74) *Attorney, Agent, or Firm* — Thomas|Kayden

(57) ABSTRACT

A microphone package includes a carrier, a cap, an integrated circuit chip, and a microphone unit. The cap covers the carrier to form a storage space. The integrated circuit chip is disposed in the storage space. The microphone unit is disposed in the storage space and stacked on the integrated circuit chip.

18 Claims, 5 Drawing Sheets

MICROPHONE PACKAGE WITH MINIMUM FOOTPRINT SIZE AND THICKNESS

BACKGROUND OF THE INVENTION

1. Field of the Invention

The invention relates to a microphone package, and more particularly to a microphone package with a minimum footprint size and thickness.

2. Description of the Related Art

Electronic devices are becoming increasingly compact and lightweight. Many electronic devices have microphones inside. Therefore, modifying the structure of a microphone to have a minimum size is required.

U.S. Pat. No. 6,781,231 discloses a microelectromechanical system package with an environmental and interference shield. As shown in FIG. 1, a cover 20 is disposed on a substrate 23. The cover 20 serving as an environmental and interference shield includes an outer cup 25a and an inner cup 25b. A plurality of electronic elements 12 is disposed in a chamber 36 formed by the cover 20 and the substrate 23. The cover 20 has a plurality of acoustic ports 44 and 48 allowing the electronic elements 12 to receive external sound.

The electronic elements 12 are arranged side-by-side, thus having a large footprint size on the substrate 23. The size of the microelectromechanical system package thus, can not meet modern electronic device requirements for extreme compactness.

U.S. Patent Application Publication No. 2007/0278601 discloses a MEMS (micro-electro-mechanical system) device. As shown in FIG. 2, a MEMS die 110 is mounted on a chip carrier 120 and encapsulated by an enclosure 130. The chip carrier 120 has an acoustic hole 125 covered by the MEMS die 110. The enclosure 130 is used for preventing transmission of any electromagnetic radiation from the MEMS die 110, and any electromagnetic radiation from interfering with the MEMS die 110. The enclosure 130 may be molded using a thermoplastic or thermosetting polymer material, such as epoxy molding compound, liquid crystal polymer, or polyetheretherketone (PEEK), and an electrically conductive material, such as metal particles or carbon fibers or fillers.

The MEMS die 110 with a microphone and an integrated circuit combined therein has a minimum size. However, the technique of combining the microphone and the integrated circuit in a MEMS die is not yet matured. Thus, the reliability of the MEMS die is not appropriately applicable.

U.S. Pat. No. 6,522,762 discloses a silicon-based sensor system. As shown in FIG. 3, a transducer 1 and an integrated circuit chip 3 are flip-chip mounted on a silicon carrier substrate 2. The transducer 1 and the integrated circuit chip 3 are electrically connected. The second surface of the silicon carrier substrate 2 is supplied with a plurality of solder bumps 22 for surface mounting onto a printed circuit board (not shown). A lid 5 provides EMI (electromagnetic interference) shielding. An EMI shield 16 is a conductive polymer layer such as silver epoxy, or a metal layer such as electroplated or evaporated Cu or Au.

Similarly, the transducer 1 and integrated circuit chip 3 are arranged side-by-side, thus having a large footprint size on the silicon carrier substrate 2. The size of the silicon-based sensor system thus cannot meet modern electronic device requirements for extreme compactness.

U.S. Pat. No. 7,202,552 discloses a MEMS package using flexible substrates. As shown in FIG. 4, the MEMS package 70 has a MEMS device 40 attached to the flexible substrate 10. A metal cap 54 encapsulates the MEMS device 40 on the flexible substrate 10. The flexible substrate 10 is folded over the metal cap 54 and glued to the top of the metal cap 54. The metal cap 54 and the metal layer of the flexible substrate 10 are electrically connected to form a Faraday cage for EMI/RF shielding.

Similarly, all the devices are arranged side-by-side, thus having a large footprint size on the flexible substrate 10. The size of the MEMS package thus cannot meet modern electronic device requirements for extreme compactness.

BRIEF SUMMARY OF THE INVENTION

The invention provides a microphone package with a minimum footprint size and thickness. The microphone package in accordance with an exemplary embodiment of the invention includes a carrier, a cap covering the carrier to form a storage space, an integrated circuit chip disposed in the storage space, and a microphone unit disposed in the storage space and stacked on the integrated circuit chip.

In another exemplary embodiment of the invention, the microphone unit has a first bottom cavity, and the integrated circuit chip has a second bottom cavity and a guide channel connecting the first bottom cavity to the second bottom cavity.

In yet another exemplary embodiment of the invention, the microphone unit is affixed to the integrated circuit chip by glue or epoxy.

In another exemplary embodiment of the invention, the microphone package further includes a bonding wire electrically connecting the microphone unit to the integrated circuit chip.

In yet another exemplary embodiment of the invention, the microphone package further includes a bonding wire electrically connecting the integrated circuit chip to the carrier.

In another exemplary embodiment of the invention, the microphone unit has a first top cavity, and the integrated circuit chip has a second top cavity.

In yet another exemplary embodiment of the invention, the integrated circuit chip further has a bottom and a guide channel extending from the second top cavity to the bottom.

In another exemplary embodiment of the invention, the microphone package further includes a bumping ball electrically connecting the microphone unit to the integrated circuit chip.

In yet another exemplary embodiment of the invention, the microphone package further includes a seal ring which encircles the bumping ball and connects the microphone unit to the integrated circuit chip.

In another exemplary embodiment of the invention, the microphone package further includes a bumping ball electrically connecting the integrated circuit chip to the carrier.

In yet another exemplary embodiment of the invention, the microphone package further includes a seal ring which encircles the bumping ball and connects the integrated circuit chip to the carrier.

In another exemplary embodiment of the invention, the integrated circuit chip has a through via.

In yet another exemplary embodiment of the invention, the cap defines an acoustic hole.

In another exemplary embodiment of the invention, the carrier defines an acoustic hole.

In yet another exemplary embodiment of the invention, the carrier is a multi-layered printed circuit board or a ceramic board.

In another exemplary embodiment of the invention, the microphone unit is a silicon-based microphone unit.

In yet another exemplary embodiment of the invention, the microphone unit includes a unidirectional microphone, an omni-directional microphone, or a microphone array.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
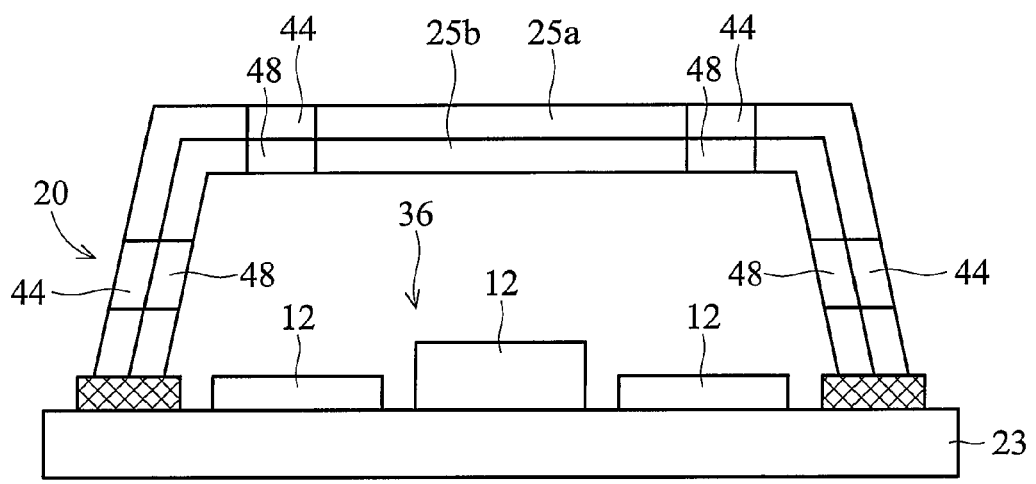
FIG. 1 is a schematic diagram of a microelectromechanical system package disclosed in U.S. Pat. No. 6,781,231.
Figure 2:
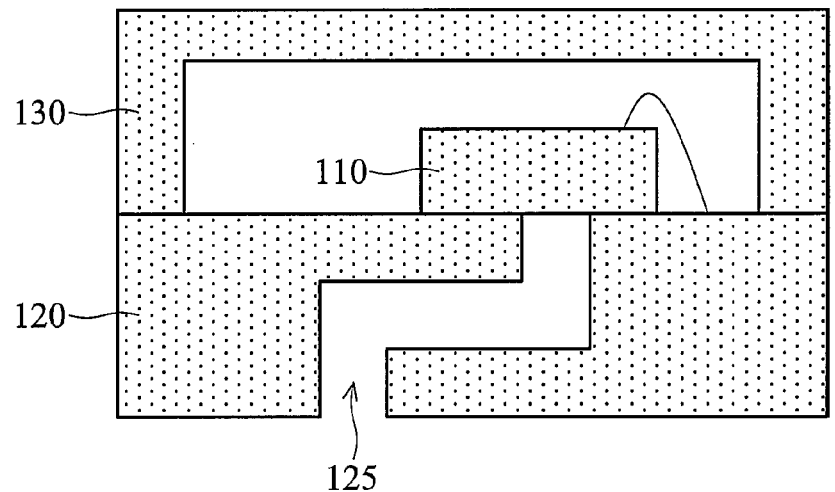
FIG. 2 is a schematic diagram of a MEMS device disclosed in U.S. Patent Application Publication No. 2007/0278601.
Figure 3:
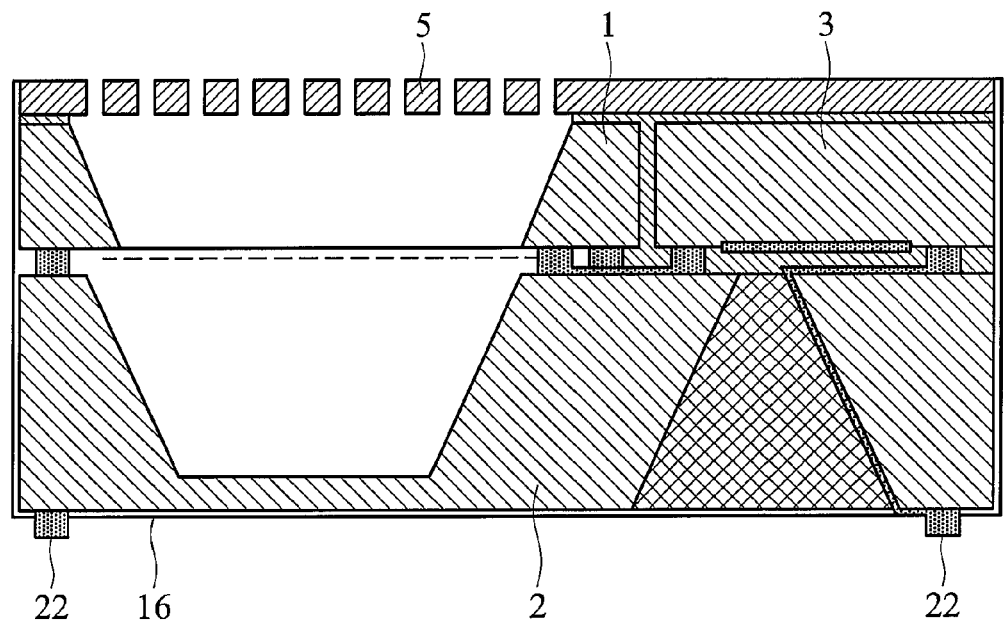
FIG. 3 is a schematic diagram of a silicon-based sensor system disclosed in U.S. Pat. No. 6,522,762.
Figure 4:
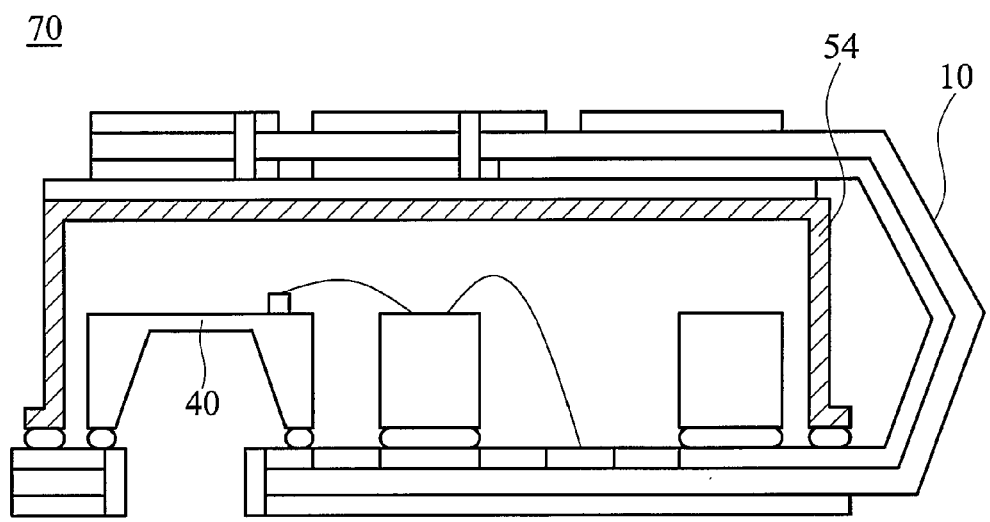
FIG. 4 is a schematic diagram of a MEMS package using flexible substrates disclosed in U.S. Pat. No. 7,202,552.
Figure 5:
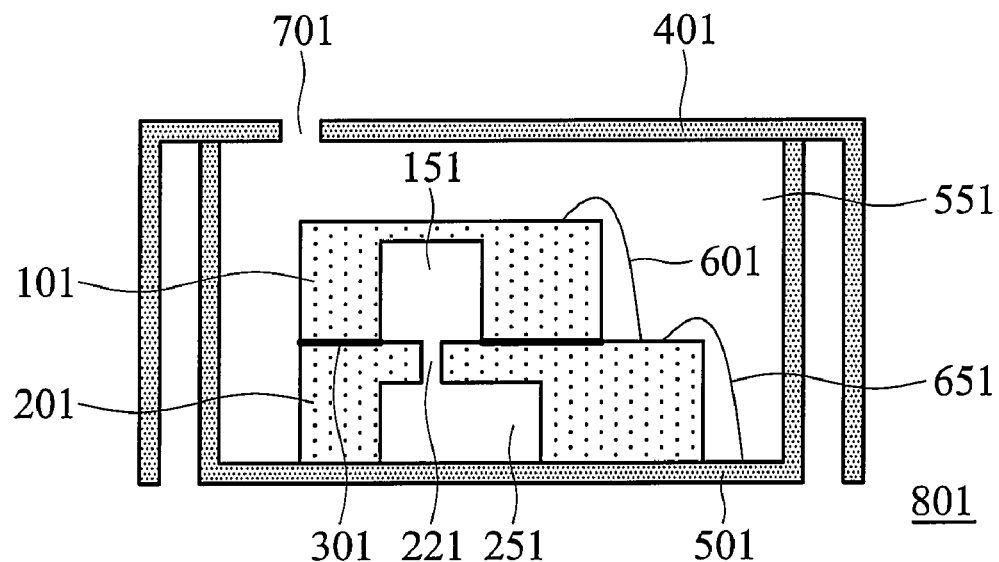
FIG. 5 is a schematic diagram of a microphone package in accordance with a first embodiment of the invention.

Referring to FIG. 5, a microphone package 801 of a first embodiment of the invention includes a carrier 501, a cap 401, an integrated circuit (IC) chip 201, and a silicon-based microphone unit 101.

The carrier 501 is a multi-layered printed circuit board (PCB) or a ceramic board, or is pre-molded to form a storage space 551. The silicon-based microphone unit 101 and the IC chip 201 are disposed in the storage space 551.

The cap 401 covers the storage space 551. An acoustic hole 701 is provided in the cap 401 allowing external sound to enter the storage space 551.

The silicon-based microphone unit 101 is affixed to the IC chip 201 by glue or epoxy 301, capable of receiving external sound through the acoustic hole 701 of the cap 401. The silicon-based microphone unit 101 is further electrically connected to the IC chip 201 through a bonding wire 601.

The IC chip 201, mounted on the carrier 501, is used for providing impedance matching and amplifying the sound signal from the silicon-based microphone unit 101. A charge pump, an analog-to-digital (A/D) converter, and a digital signal processor (DSP) may be included in the IC chip 201. Furthermore, the IC chip 201 is electrically connected to the carrier 501 through a bonding wire 651.

The silicon-based microphone unit 101 is stacked on the IC chip 201 for reducing the footprint size. The silicon-based microphone unit 101 has a bottom cavity 151 in which air is compressed for vibrations of the diaphragm (not shown). To achieve this, the cavity 151 should not be too small. However, the size of the cavity 151 is limited by the height of the microphone package 801. In the first embodiment, therefore, the IC chip 201 is provided with a bottom cavity 251 and at least one guide channel 221 connecting the cavity 251 to the cavity 151. The cavities 151 and 251 provide a sufficient space for the vibrations of the diaphragm of the silicon-based microphone unit 101.

The silicon-based microphone unit 101 may include a unidirectional microphone, an omni-directional microphone, or a microphone array.

Figure 6:
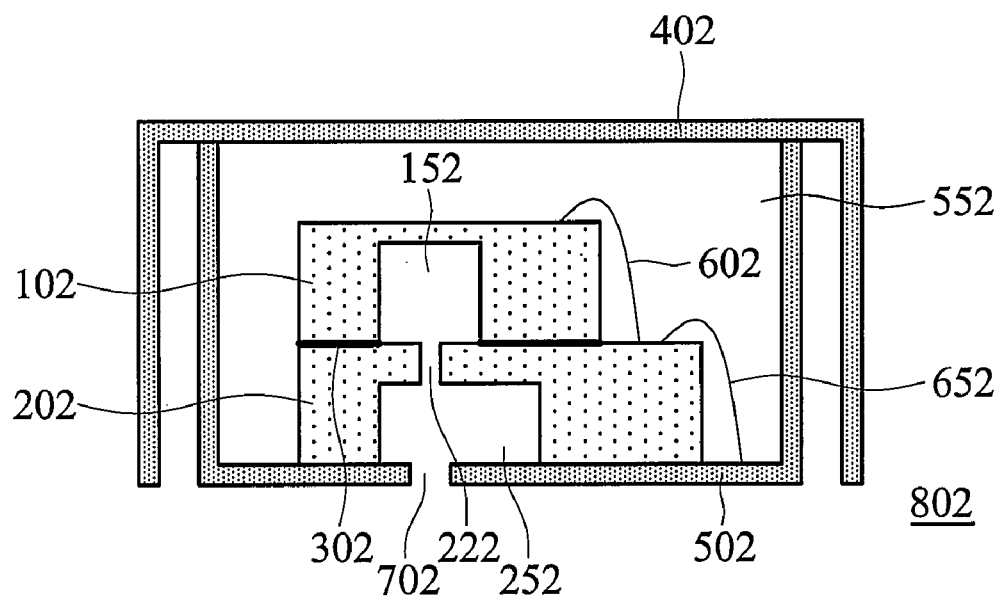
FIG. 6 is a schematic diagram of a microphone package in accordance with a second embodiment of the invention.

Referring to FIG. 6, a microphone package 802 of a second embodiment of the invention includes a carrier 502, a cap 402, an integrated circuit (IC) chip 202, and a silicon-based microphone unit 102.

The carrier 502 is a multi-layered printed circuit board (PCB) or a ceramic board, or is pre-molded to form a storage space 552. The silicon-based microphone unit 102 and the IC chip 202 are disposed in the storage space 552. An acoustic hole 702 is provided in the carrier 502 allowing external sound to enter the storage space 552.

The cap 402 covers the storage space 552.

The silicon-based microphone unit 102 is affixed to the IC chip 202 by glue or epoxy 302, capable of receiving external sound through the acoustic hole 702 of the cap 402. The silicon-based microphone unit 102 is further electrically connected to the IC chip 202 through a bonding wire 602.

The IC chip 202, mounted on the carrier 502, is used for providing impedance matching and amplifying the sound signal from the silicon-based microphone unit 102. A charge pump, an analog-to-digital (A/D) converter, and a digital signal processor (DSP) may be included in the IC chip 202. Furthermore, the IC chip 202 is electrically connected to the carrier 502 through a bonding wire 652.

The silicon-based microphone unit 102 is stacked on the IC chip 202 for reducing the footprint size. The silicon-based microphone unit 102 has a bottom cavity 152. The IC chip 202 is provided with a bottom cavity 252 and at least one guide channel 222 connecting the bottom cavity 252 to the bottom cavity 152. The cavities 152 and 252 provide a sufficient space for the vibrations of the diaphragm of the silicon-based microphone unit 102.

The silicon-based microphone unit 102 may include a unidirectional microphone, an omni-directional microphone, or a microphone array.

Figure 7:
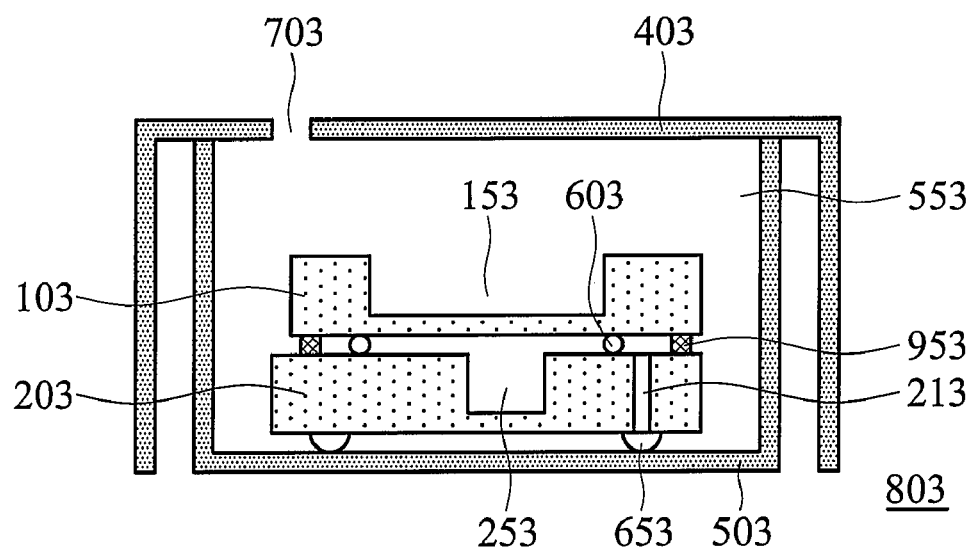
FIG. 7 is a schematic diagram of a microphone package in accordance with a third embodiment of the invention.

Referring to FIG. 7, a microphone package 803 of a third embodiment of the invention includes a carrier 503, a cap 403, an integrated circuit (IC) chip 203, and a silicon-based microphone unit 103.

The carrier 503 is a multi-layered printed circuit board (PCB) or a ceramic board, or is pre-molded to form a storage space 553. The silicon-based microphone unit 103 and the IC chip 203 are disposed in the storage space 553.

The cap 403 covers the storage space 553. An acoustic hole 703 is provided in the cap 403 allowing external sound to enter the storage space 553.

The silicon-based microphone unit 103 is manufactured by the flip chip process, has a top cavity 153, and is capable of receiving external sound through the acoustic hole 703 of the cap 403.

The silicon-based microphone unit 103 and the IC chip 203 are electrically connected through a plurality of bonding balls 603. A seal ring 953, encircling the bonding balls 603, is connected between the silicon-based microphone unit 103 and the IC chip 203 for preventing sound leakage.

The IC chip 203 is manufactured by the flip chip process and has a top cavity 253.

The IC chip 203, supported by the carrier 503, is used for providing impedance matching and amplifying the sound signal from the silicon-based microphone unit 103. A charge pump, an analog-to-digital (A/D) converter, and a digital signal processor (DSP) may be included in the IC chip 203. Furthermore, the IC chip 203 is electrically connected to the carrier 503 through a plurality of bonding balls 653.

At least one through via 213 is provided in the IC chip 203 for electrically connecting the silicon-based microphone unit 103 and the IC chip 203. This arrangement is capable of effectively reducing the stray capacitance and noise, and increasing the sensitivity and the signal-to-noise ratio (SNR).

The silicon-based microphone unit 103 is stacked on the IC chip 203 for reducing the footprint size.

The silicon-based microphone unit 103 may include a uni-directional microphone, an omni-directional microphone, or a microphone array.

Figure 8:
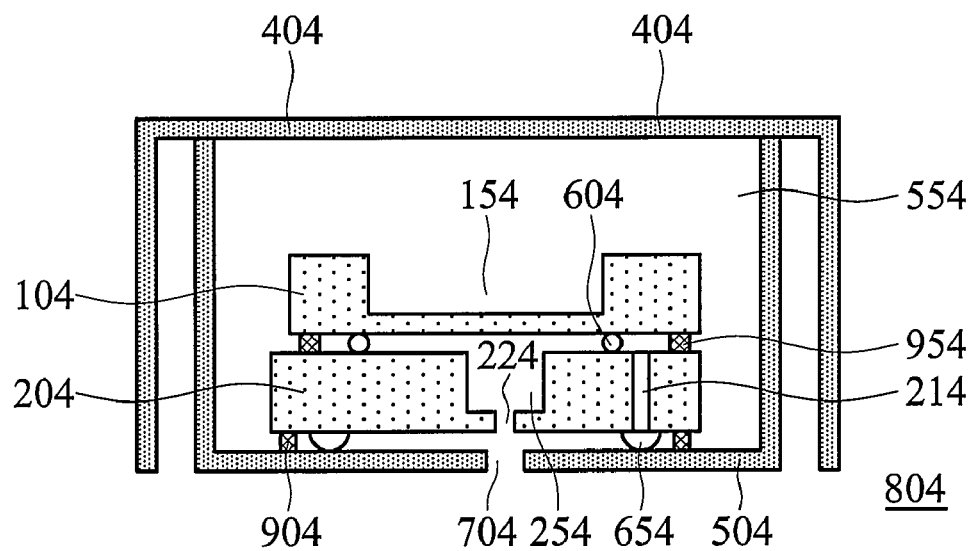
FIG. 8 is a schematic diagram of a microphone package in accordance with a fourth embodiment of the invention.

Referring to FIG. 8, a microphone package 804 of a fourth embodiment of the invention includes a carrier 504, a cap 404, an integrated circuit (IC) chip 204, and a silicon-based microphone unit 104.

The carrier 504 is a multi-layered printed circuit board (PCB) or a ceramic board, or is pre-molded to form a storage space 554. The silicon-based microphone unit 104 and the IC chip 204 are disposed in the storage space 554. The cap 404 covers the storage space 554. An acoustic hole 704 is provided in the carrier 504 allowing external sound to enter the storage space 554.

The silicon-based microphone unit 104 is manufactured by the flip chip process, has a top cavity 154, and is capable of receiving external sound through the acoustic hole 704 of the carrier 504.

The silicon-based microphone unit 104 and the IC chip 204 are electrically connected through a plurality of bonding balls 604. A seal ring 954, encircling the bonding balls 604, is connected between the silicon-based microphone unit 104 and the IC chip 204 for preventing sound leakage.

The IC chip 204 and the carrier 504 are electrically connected through a plurality of bonding balls 654. A seal ring 904, encircling the bonding balls 654, is connected between the carrier 504 and the IC chip 204 for preventing sound leakage.

The IC chip 204 is manufactured by the flip chip process, and has a top cavity 254 and a guide channel 224 extending from the top cavity 254 to the bottom. External sound is capable of passing through the acoustic hole 704 and the guide channel 224, entering the top cavity 254, and vibrating the diaphragm of the silicon-based microphone unit 104.

The IC chip 204 is used for providing impedance matching and amplifying the sound signal from the silicon-based microphone unit 104. A charge pump, an analog-to-digital (A/D) converter, and a digital signal processor (DSP) may be included in the IC chip 204.

At least one through via 214 is provided in the IC chip 204 for electrically connecting the silicon-based microphone unit 104 and the IC chip 204. This arrangement is capable of effectively reducing the stray capacitance and noise, and increasing the sensitivity and the signal-to-noise ratio (SNR).

The silicon-based microphone unit 104 is stacked on the IC chip 204 for reducing the footprint size.

The silicon-based microphone unit 104 may include a uni-directional microphone, an omni-directional microphone, or a microphone array.

Figure 9:
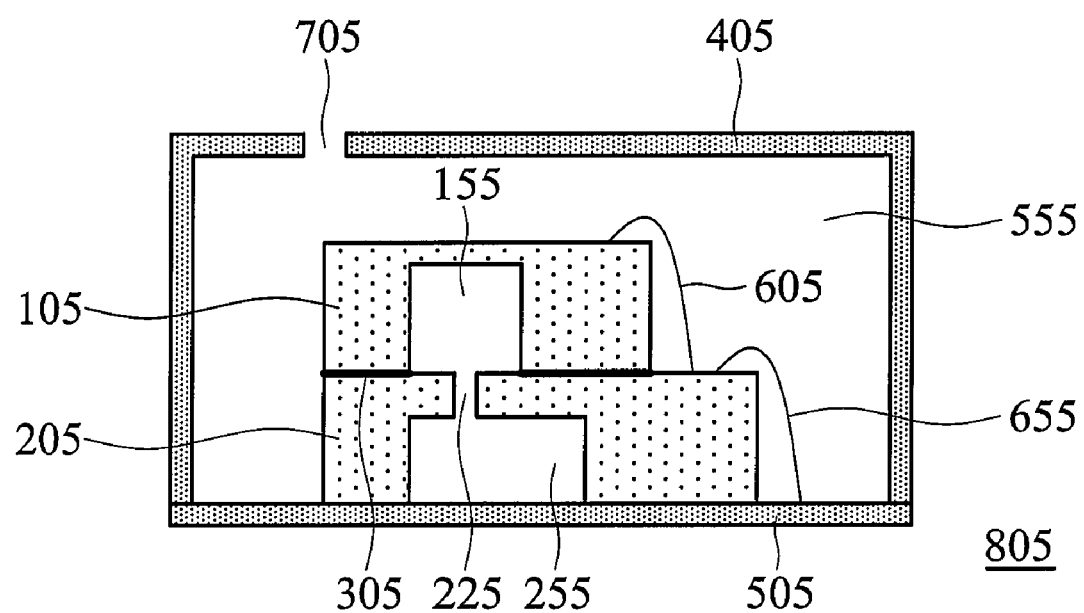
FIG. 9 is a schematic diagram of a microphone package in accordance with a fifth embodiment of the invention.

Referring to FIG. 9, a microphone package 805 of a fifth embodiment of the invention includes a carrier 505, a cap 405, an integrated circuit (IC) chip 205, and a silicon-based microphone unit 105.

The carrier 505 is a multi-layered printed circuit board (PCB) or a ceramic board, or is pre-molded to form a storage space 555. The silicon-based microphone unit 105 and the IC chip 205 are disposed in the storage space 555.

The cap 405 covers the storage space 555. An acoustic hole 705 is provided in the cap 405 allowing external sound to enter the storage space 555.

The silicon-based microphone unit 105 is affixed to the IC chip 205 by glue or epoxy 305, capable of receiving external sound through the acoustic hole 705 of the cap 405. The silicon-based microphone unit 105 is further electrically connected to the IC chip 205 through a bonding wire 605.

The IC chip 205, mounted on the carrier 505, is used for providing impedance matching and amplifying the sound signal from the silicon-based microphone unit 105. A charge pump, an analog-to-digital (A/D) converter, and a digital signal processor (DSP) may be included in the IC chip 205. Furthermore, the IC chip 205 is electrically connected to the carrier 505 through a bonding wire 655.

The silicon-based microphone unit 105 is stacked on the IC chip 205 for reducing the footprint size. The silicon-based microphone unit 105 has a bottom cavity 155. The IC chip 205 has a bottom cavity 255 and at least one guide channel 225 connecting the cavity 255 to the cavity 155. The cavities 155 and 255 provide a sufficient space for the vibrations of the diaphragm of the silicon-based microphone unit 105.

The silicon-based microphone unit 105 may include a uni-directional microphone, an omni-directional microphone, or a microphone array.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A microphone package, comprising:
   a carrier;
   a cap covering the carrier to form a storage space;
   an integrated circuit chip disposed in the storage space; and
   a microphone unit disposed in the storage space and stacked on the integrated circuit chip, wherein the microphone unit has a first bottom cavity, and the integrated circuit chip has a second bottom cavity and a guide channel connecting the first bottom cavity to the second bottom cavity.

2. The microphone package as claimed in claim 1, wherein the microphone unit is affixed to the integrated circuit chip by glue or epoxy.

3. The microphone package as claimed in claim 1, further comprising a bonding wire electrically connecting the microphone unit to the integrated circuit chip.

4. The microphone package as claimed in claim 1, further comprising a bonding wire electrically connecting the integrated circuit chip to the carrier.

5. The microphone package as claimed in claim 1, wherein the microphone unit has a first top cavity, and the integrated circuit chip has a second top cavity.

6. The microphone package as claimed in claim 5, wherein the integrated circuit chip further has a bottom and a guide channel extending from the second top cavity to the bottom.

7. The microphone package as claimed in claim 1, further comprising a bumping ball electrically connecting the microphone unit to the integrated circuit chip.

8. The microphone package as claimed in claim 7, further comprising a seal ring which encircles the bumping ball and connects the microphone unit to the integrated circuit chip.

9. The microphone package as claimed in claim 1, further comprising a bumping ball electrically connecting the integrated circuit chip to the carrier.

10. The microphone package as claimed in claim 9, further comprising a seal ring which encircles the bumping ball and connects the integrated circuit chip to the carrier.

11. The microphone package as claimed in claim 1, wherein the integrated circuit chip has a through via.

12. The microphone package as claimed in claim 1, wherein the cap defines an acoustic hole.

13. The microphone package as claimed in claim 1, wherein the carrier defines an acoustic hole.

14. The microphone package as claimed in claim 1, wherein the carrier is a multi-layered printed circuit board or a ceramic board.

15. The microphone package as claimed in claim 1, wherein the microphone unit is a silicon-based microphone unit.

16. The microphone package as claimed in claim 1, wherein the microphone unit includes a uni-directional microphone, an omni-directional microphone, or a microphone array.

17. A microphone package, comprising:
a carrier;
a cap covering the carrier to form a storage space;
an integrated circuit chip disposed in the storage space;
a microphone unit disposed in the storage space and stacked on the integrated circuit chip; and
a bumping ball electrically connecting the microphone unit to the integrated circuit chip.

18. A microphone package, comprising:
a carrier;
a cap covering the carrier to form a storage space;
an integrated circuit chip disposed in the storage space;
a microphone unit disposed in the storage space and stacked on the integrated circuit chip; and
a bumping ball electrically connecting the integrated circuit chip to the carrier.

\* \* \* \* \*